United States Patent
Juso et al.

(10) Patent No.: US 6,265,783 B1
(45) Date of Patent: Jul. 24, 2001

(54) RESIN OVERMOLDED TYPE SEMICONDUCTOR DEVICE

(75) Inventors: Hiroyuki Juso, Gose; Yoshiki Sota, Nara, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/460,243

(22) Filed: Dec. 13, 1999

(30) Foreign Application Priority Data

Jan. 27, 1999 (JP) .................................................. 11-018225

(51) Int. Cl.$^7$ .................................................... H01L 23/48
(52) U.S. Cl. .................... 257/786; 257/738; 257/777; 257/778; 257/780
(58) Field of Search ..................................... 257/686, 738, 257/777, 778, 780, 786, 737; 174/52.3, 52.4, 251; 361/735, 790

(56) References Cited

U.S. PATENT DOCUMENTS

| 5,874,776 | * | 2/1999 | Kresge et al. | 257/747 |
| 6,130,480 | * | 10/2000 | Ohuchi et al. | 257/738 |
| 6,157,080 | * | 12/2000 | Tamaki et al. | 257/738 |
| 6,157,085 | * | 12/2000 | Terashima | 257/783 |

FOREIGN PATENT DOCUMENTS

| 5129366 | * | 5/1993 | (JP) | 257/686 |
| 9-171002 | | 6/1997 | (JP) . | |

* cited by examiner

*Primary Examiner*—Eddie Lee
*Assistant Examiner*—Lourdes Cruz
(74) *Attorney, Agent, or Firm*—Nixon & Vanderhye, P.C.

(57) ABSTRACT

A resin overmolded semiconductor device includes an insulative substrate having a plurality of first through-holes, interconnection patterns provided on a chip-side surface of the insulative substrate, external connection terminals provided on the opposite surface of the insulative substrate, a semiconductor chip mounted on the chip-side surface, and a sealing portion. The insulative substrate is further formed with a plurality of second through-holes each having one end which is open on the opposite surface, and has second lands which cover the other ends of the second through-holes on the chip-side surface.

9 Claims, 7 Drawing Sheets

RESIN OVERMOLDED TYPE SEMICONDUCTOR DEVICE

CROSS-REFERENCES TO RELATED APPLICATIONS

This application is related to Japanese patent application No. HEI 11(1999)-018225 filed on Jan. 27, 1999 whose priority is claimed under 35 USC §119, the disclosure of which is incorporated herein by reference in its entirety.

BACKGROUND OF THE INVENTION

1. Field of the Invention

The present invention relates to a resin overmolded type semiconductor device and, more particularly, to a resin overmolded type semiconductor device having a reduced size close to a chip size.

2. Description of the Prior Art

In recent years, resin overmolded type semiconductor devices have widely been used which include chip size packages (CSPs) such as QFPs (quad flat packages) and BGA (ball grid array) packages which meet demands for reduction of the size (thickness and plan surface area) and weight of electronic systems and for automation of fabrication processes. Since a semiconductor chip contained in such a semiconductor device is required to meet demands for higher-speed signal processing and higher performance, it is necessary to provide a greater number of external connection terminals on the semiconductor device.

In such a case, the semiconductor device employs a BGA package which has external connection terminals two-dimensionally arranged in a matrix array on a bottom face thereof. Further, the size of the semiconductor device is reduced as much as possible or close to a chip size for incorporation of the semiconductor device in a small size portable system. One exemplary BGA package is constructed such that a semiconductor chip formed with a MOS transistor and the like is mounted face-up on an interconnection board by a wire bonding method for connection to external connection terminals via interconnection patterns.

Figure 9:
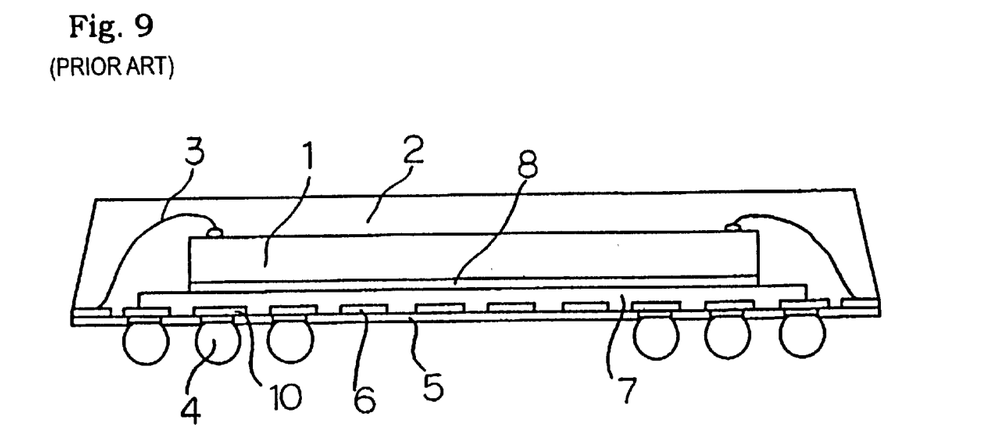
FIG. 9 is a sectional view illustrating a conventional resin overmolded semiconductor device.

As shown in FIG. 9, a resin overmolded semiconductor device of the prior art comprises: an interconnection board including an insulative substrate 5 formed with interconnection patterns 6 having wire connection portions, lands 10 and interconnections connecting the wire connection portions to the lands 10, and an interconnection protective film 7 of a solder resist; a semiconductor chip 1 bonded on the interconnection board by an adhesive film 8; wires 3 connecting electrode pads of the semiconductor chip 1 to the interconnection patterns 6; a resin sealer 2 sealing one side of the interconnection board for protection of the semiconductor chip 1 and the wires 3; and external connection terminals 4 formed on a lower face of the insulative substrate 5 as solder balls which extend through through-holes formed in the insulative substrate 5 for connection to the lands 10 of the interconnection patterns 6. The resin overmolded semiconductor device is mounted along with resistors and capacitors on a mount board, which is in turn incorporated in a small size portable system.

Figure 10:
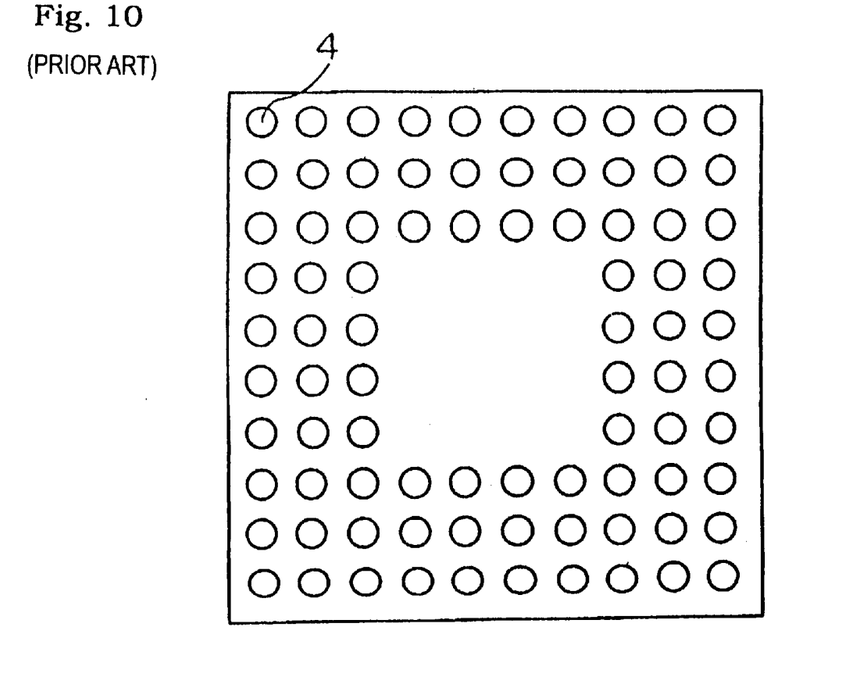
FIG. 10 is a plan view illustrating the conventional resin overmolded semiconductor device of FIG. 9 as viewed from the side of external connection terminals formed thereon.

The external connection terminals 4 of the resin overmolded semiconductor device having a size close to a chip size are uniformly arranged over the lower face of the semiconductor device or, if the number of the external connection terminals 4 is small, arranged in a peripheral portion, but not entirely nor in a central portion, of the lower face of the semiconductor device as shown in FIGS. 9 and 10. This is because arranging the external connection terminals in the peripheral portion is more advantageous for the interconnection on the mount board than arranging the external connection terminals at a greater pitch over the entire lower face.

Figure 11:
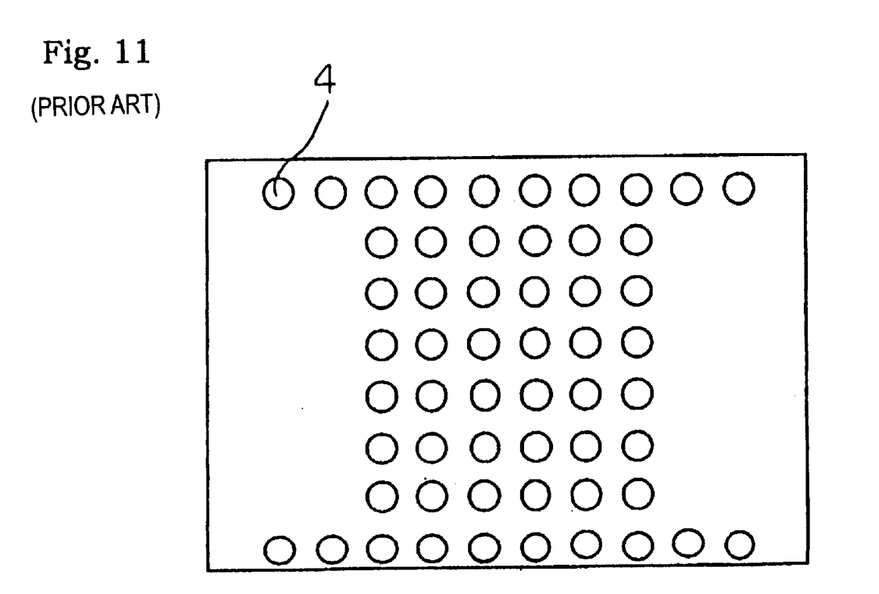
FIG. 11 is a plan view illustrating a second conventional resin overmolded semiconductor device as viewed from the side of external connection terminals formed thereon.

In some cases, conversely, the external connection terminals are arranged only in the central portion of the resin overmolded semiconductor device as shown in FIG. 11. This arrangement is employed to allow semiconductor devices such as memory devices having different capacities and different package sizes (chip sizes) to have a common signal terminal array.

In some cases, land patterns are formed in a portion of an upper face (chip-side face) of the insulative substrate of the semiconductor device where neither the external connection terminals nor the through-holes are formed therebelow as shown in FIGS. 10 and 11. With this arrangement, the upper face of the interconnection board on which the chip is mounted is planarized, so that formation of a void under the chip can be prevented which may otherwise occur due to presence of an air bubble during a chip mounting process. Thus, the semiconductor device is prevented from suffering from thermal defect during a reflow process. Provision of no dummy solder ball in the central portion of the lower face of the semiconductor device suppresses an increase in the cost of a solder ball material, a reduction in the productivity, and a reduction in the planarity of the external connection terminals, and increases routing flexibility of interconnection on the mount board.

The aforesaid resin overmolded semiconductor device, which is of a small size and has an area array structure, is mounted on the mount board through the reflow process. Since the interconnection patterns are present under the solder resist film on the interconnection board, the surface of the solder resist film is not planar. If the planarity of the solder resist film on the interconnection patterns is reduced, a die-bonding pressure cannot sufficiently be applied onto a depressed portion of the solder resist film when the semiconductor chip is die-bonded onto the solder resist film with the use of the adhesive film, thereby failing to provide a sufficient adhesion strength between the adhesive film and the solder resist film.

In s uch a case, moisture Is liable to be adsorbed on a n interface between the solde r resist film and the adhesive film. Since the Interconnection board, the solder resist f ilm and the adhesive f ilm are each composed of an organic material, not only the bonding interf ace but also these components have moisture adsorptive properties. When the semiconductor device is subjected to rapid heating In the reflow process, the moisture contained in the semiconductor device is rapidly heated to be expanded. Hence, the semiconductor device suffer from apparent defects such as separation of the interconnection board from the resin sealer and breakage of the interconnection patterns.

Figure 12:
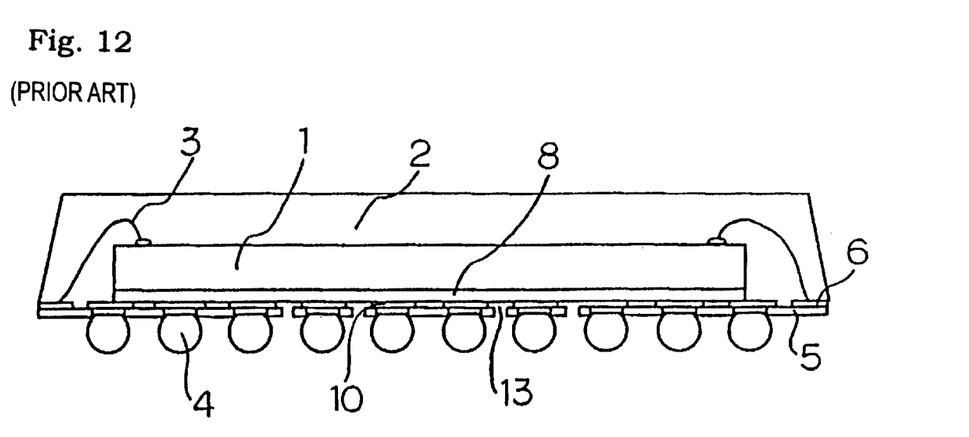
FIG. 12 is a sectional view illustrating a third conventional resin overmolded semiconductor device.

For prevention of the separation of the bonded surfaces and a like inconvenience which may occur when the resin overmolded semiconductor device is mounted on the mount board through the reflow process, Japanese Unexamined Patent Publication No. 9-12100 2(1997) proposes a resin overmolded semiconductor device which is constructed such that small holes 13 are formed in an insulative substrate thereof to effectively release moisture from the inside thereof as shown in FIG. 12.

In general, the interconnection board of the resin overmolded semiconductor device is produced by forming through-holes in a polyimide insulative substrate on which an adhesive is applied, bonding a Cu foil on the substrate, patterning the Cu foil to form interconnection patterns, applying a solder resist on the interconnection patterns by printing, and performing Au plating. If the formation of the small holes are carried out simultaneously with the formation of the through-holes, the solder resist undesirably spreads to the lower side of the substrate on which the solder balls are to be provided during the printing of the solder resist.

For prevention of the spreading of the solder resist, the formation of the small holes may be carried out after the printing of the solder resist, but additionally requires a punching die and a hole formation step. Therefore, the formation of the small holes is not desirable. Without the provision of the small holes for the release of the moisture, however, there is a possibility that the substrate may swell when the semiconductor device is rapidly heated during the mounting thereof through the reflow process.

During the reflow process, the swelling occurs mainly in a region of the insulative substrate where no external connection terminal is present. This is because water vapor is partly released from the semiconductor device through land junctures and the through-holes, but no path for the release of the water vapor is present in that region formed with no external connection terminal thereby to cause the swelling, the separation and the like.

SUMMARY OF THE INVENTION

In accordance with the present invention, there is provided a resin overmolded semiconductor device which comprises: an insulative substrate having a plurality of first through-holes formed therein; interconnection patterns provided on a chip-side surface of the insulative substrate and having first lands covering the first through-holes; external connection terminals provided on a surface of the insulative substrate opposite from the chip-side surface and extending through the first through-holes to be connected to the first lands; a semiconductor chip mounted on the chip-side surface of the insulative substrate and electrically connected to the interconnection patterns; and a sealing portion in which the semiconductor chip is sealed with a resin; wherein the insulative substrate is further formed with a plurality of second through-holes each having one end which is open on the surface of the insulative substrate opposite from the chip-side surface, and has second lands which cover the other ends of the second through-holes on the chip-side surface of the insulative substrate and are not connected to the external connection terminals.

In the resin overmolded semiconductor device of the present invention, the first lands and the second lands are arranged in a matrix array.

In the resin overmolded semiconductor device of the present invention, the second lands are connected to each other to form at least one land group.

In the resin overmolded semiconductor device of the present invention, the second lands are selectively connected to the interconnection patterns.

DETAILED DESCRIPTION OF THE PREFERRED EMBODIMENTS

The present invention will hereinafter be described in detail by way of embodiments thereof.

Figure 1:
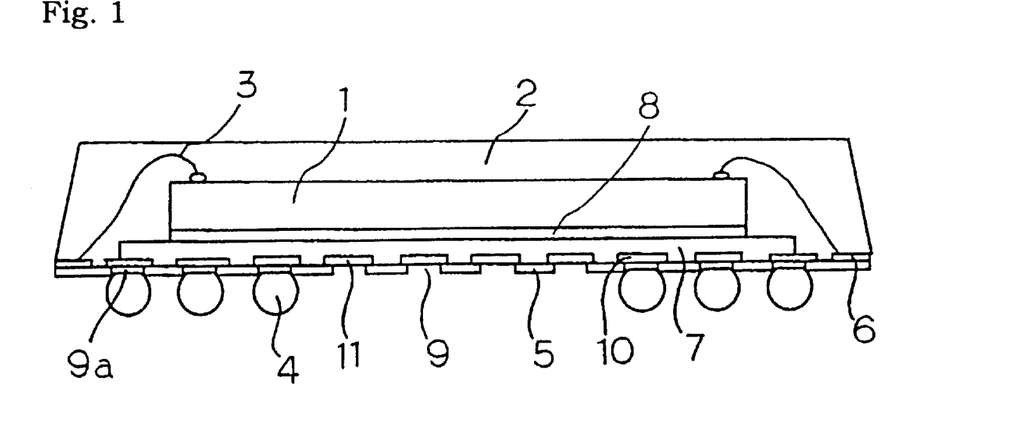
FIG. 1 is a sectional view illustrating a resin overmolded semiconductor device according to a first embodiment of the present invention.
Figure 2:
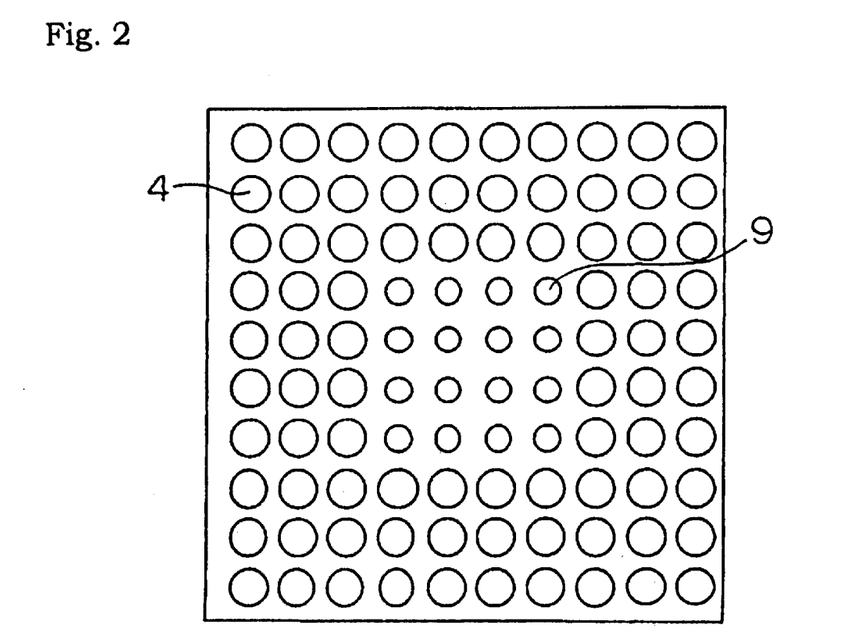
FIG. 2 is a plan view illustrating the resin overmolded semiconductor device of the first embodiment as viewed from the side of external connection terminals formed thereon.

FIG. 1 is a sectional view illustrating a semiconductor device according to a first embodiment of the present invention, and FIG. 2 is a plan view illustrating the semiconductor device as viewed from the side of external connection terminals formed thereon. The semiconductor device according to this embodiment is of a square CSP type, and its external connection terminals 4 are arranged in a peripheral portion of a surface of an insulative substrate 5 opposite from a chip-side surface on which interconnection patterns 6 are formed. The insulative substrate 5 has through-holes 9 formed in a central portion thereof and each having one end which is open on the surface thereof opposite from the chip-side surface, and lands 11 (hereinafter referred to as "dummy lands") which cover the other ends of the through-holes 9 on the chip-side surface of the insulative substrate 5 and are not connected to the external connection terminals 4. The interconnection patterns 6 are provided on the chip-side surface of the insulative substrate 5, and lands 10 formed as parts of the interconnection patterns 6 for connection to the external connection terminals 4 are arranged in an area array on the chip-side surface. An interconnection protective film 7 of a solder resist is provided over the interconnection patterns 6 and the dummy lands 11 on the insulative substrate 5. A semiconductor chip 1 is mounted on the insulative substrate 5, and electrode pads of the semiconductor chip 1 are respectively wire-bonded to the interconnection patterns 6 on the insulative substrate 5 by Au wires 3 for electrical connection between the semiconductor chip 1 and the interconnection patterns 6. The mounting of the semiconductor chip 1 is achieved by applying an adhesive film 8 on a back face of the semiconductor chip 1 and bonding the semiconductor chip 1 onto the solder resist film 7 by press and heat. The semiconductor chip 1 and the Au wires 3 are sealed in a resin sealer 2. The sealing is achieved by a transfer molding method. The external connection terminals 4 are formed as solder balls which extend through through-holes 9a formed in the insulative substrate 5 for connection to the lands 10. As described above, the insulative substrate 5 has, in addition to the lands 10 connected to the external connection terminals 4, the dummy lands 11 which respectively cover the through-holes 9 and are not connected to the solder balls of the external connection terminals 4.

The interconnection patterns 6 and the dummy lands 11 are Au-plated thereby to be free from oxidation. In this embodiment, the size and shape of the dummy lands 11 are the same as those of the lands 10 connected to the external connection terminals 4. The lands 10 are arranged in the same matrix array as the external connection terminals 4. It is however noted that the dummy lands 11 arenotnecessarily required to have the same size and shape as the lands 10 connected to the external connection terminals 4 and to be arranged in a matrix array. However, the lands 10 and the dummy lands 11 should have a greater size than the diameter of the through-holes 9a and 9.

The number of the dummy lands 11 is not particularly limited, but may be determined so that moisture can sufficiently be released from the semiconductor device in a reflow process to prevent the semiconductor device from swelling.

The dummy lands 11 which are thus constructed to release the moisture from the semiconductor device in the reflow process, may either entirely or partially cover the through-holes 9. Where the dummy lands 11 are constructed to partially cover the through-holes 9, however, a consideration should be given to prevent the solder resist from spreading through the through-holes 9 to the back side of the insulative substrate 5 on which the solder balls are provided, when the solder resist is applied on the insulative substrate 5 by printing.

The provision of the dummy lands 11 allows for the release of the moisture contained in the semiconductor device, particularly, moisture entrapped between the interconnection patterns and the solder resist film 7 and between the solder resist f ilm 7 and the adhesive film 8. The moisture will partly be released through the lands 10. It is therefore desirable that the lands 10 and the dummy lands 11 are not localized in one portion of the substrate but arranged uniformly over the substrate. The dummy lands 11 are preferably arranged uniformly over the substrate, if conditions for the interconnection permit.

The dummy lands 11 are located within a region of the substrate covered with the printed solder resist film, and the relative positions of the dummy lands 11 with respect to the semiconductor chip 1 is not particularly limited. For example, the dummy lands 11 may be located in a central portion or in a peripheral portion of the substrate as viewed in plan.

Further, the dummy lands 11 may be provided independently of the interconnection patterns 6 or as parts of the interconnection patterns 6. Further, the plurality of dummy lands 11 may be connected to each other to form one or more dummy land groups.

The number of semiconductor chips to be incorporated in the semiconductor device is not particularly limited. A single semiconductor chip may be incorporated in the semiconductor device, or a plurality of semiconductor chips may be arranged in a stacked relation or in the same plane in the semiconductor device.

If the dummy lands 11 have a smaller size than the lands 10, a larger blank area is present on the substrate, so that routing flexibility of the interconnections is increased. Conversely, if the dummy lands 11 have a greater size than the lands 10, a smaller blank area is present on the substrate, so that the planarity of the substrate is increased.

Figure 3:
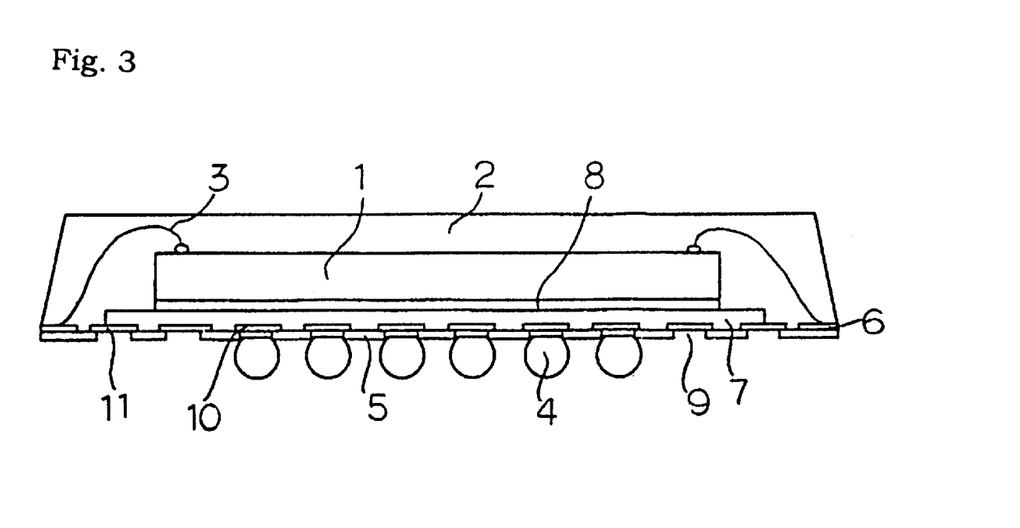
FIG. 3 is a sectional view illustrating a resin overmolded semiconductor device according to a second embodiment of the present invention.
Figure 4:
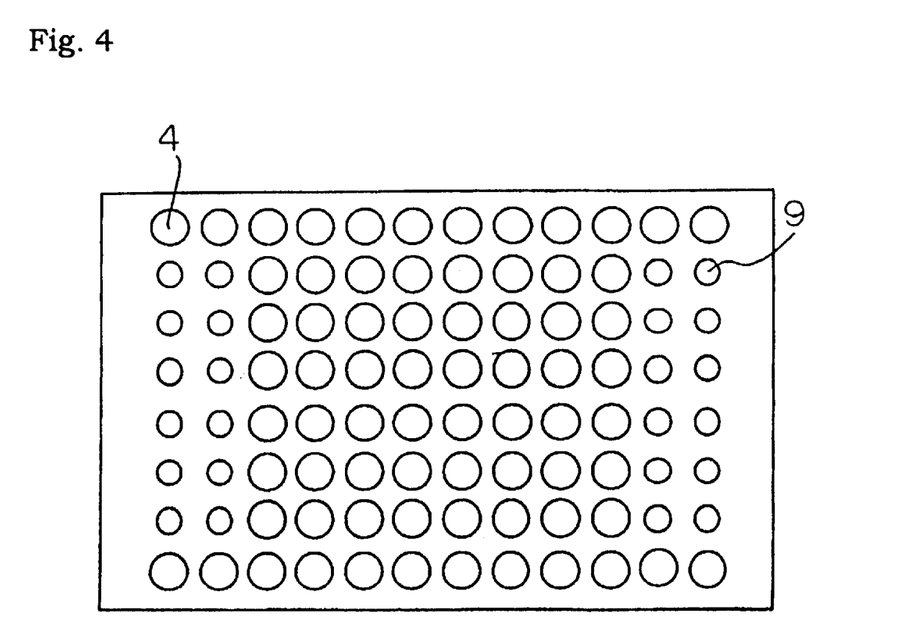
FIG. 4 is a plan view illustrating the resin overmolded semiconductor device of the second embodiment as viewed from the side of external connection terminals formed thereon.
Figure 5A:
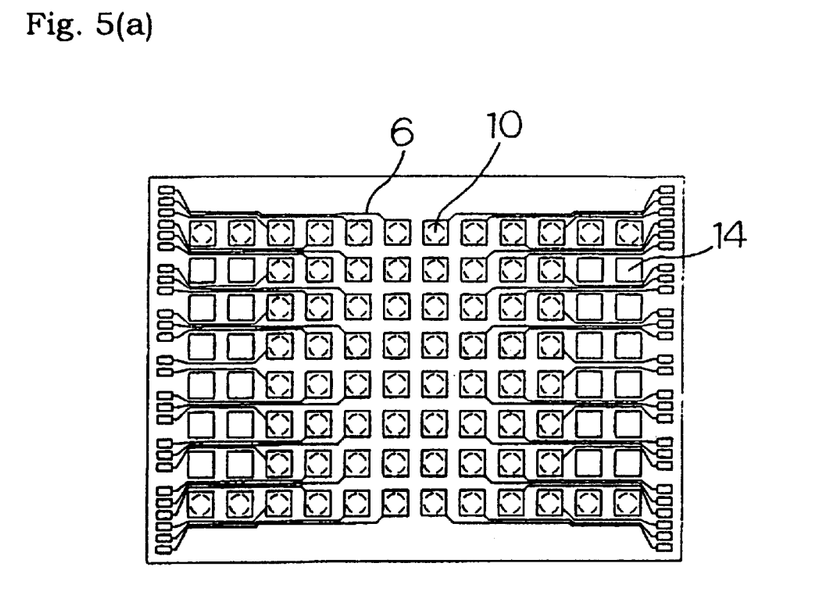
FIG. 5(a) is a plan view illustrating an interconnection board as viewed from the side of interconnection patterns formed on an insulative substrate wherein dummy lands are independent of the interconnection patterns in accordance with the present invention.

FIG. 3 is a sectional view illustrating a semiconductor device according to a second embodiment of the present invention, and FIG. 4 is a plan view illustrating the semiconductor device of FIG. 3 as viewed from the side of external connection terminals formed thereon. The semiconductor device according to this embodiment is rectangular, and its external connection terminals 4 are arranged in a central portion and longitudinal edge portions of an insulative substrate 5. Dummy lands 11 which are not connected to the external connection terminals 4 are arranged in transverse edge portions of the insulative substrate 5. These dummy lands 11 are formed as patterns 14 independent of signal interconnections as shown in FIG. 5(a).

Figure 6:
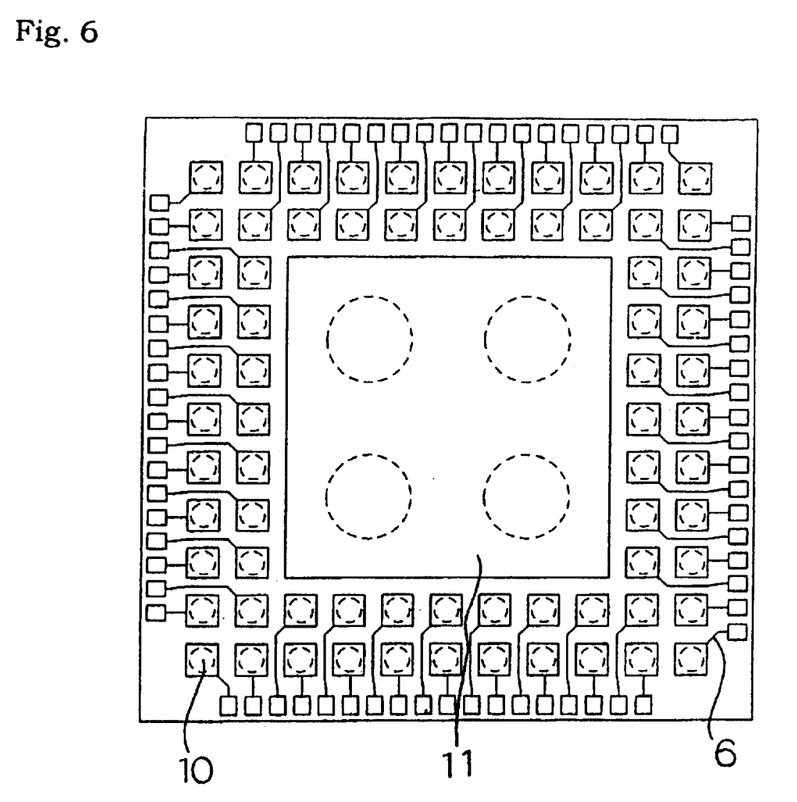
FIG. 6 is a plan view illustrating an interconnection board as viewed from the side of interconnection patterns formed on an insulative substrate wherein a single large dummy land is provided on the substrate.

Further, a group of plural dummy lands 11 may be connected to each other to form a larger dummy land, or all the dummy lands are connected to each other to form a single large dummy land 11 as shown in FIG. 6. These arrangements improve the planarity of the surface of the solder resist film 7 on the substrate 5.

Figure 5B:
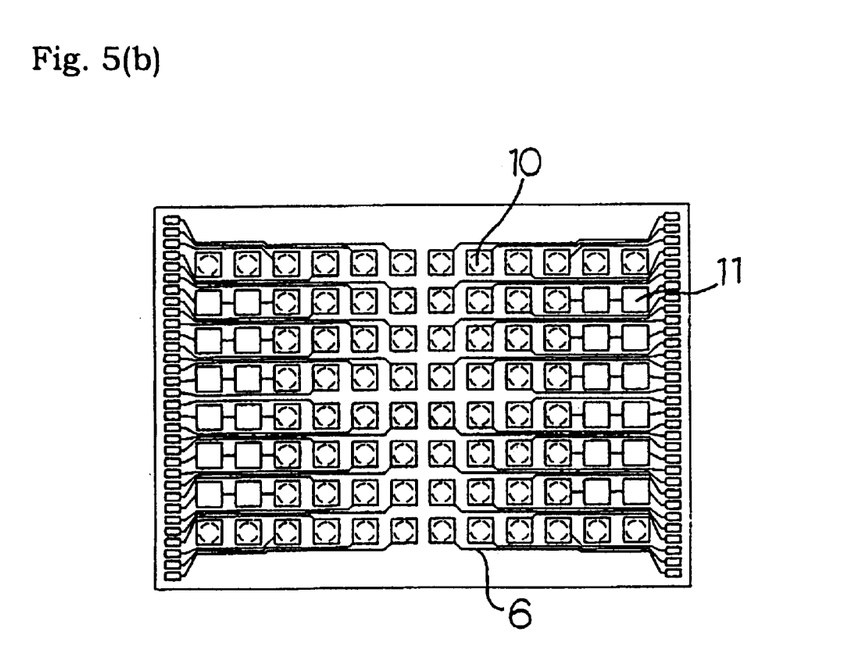
FIG. 5(b) is a plan view illustrating an interconnection board as viewed from the side of interconnection patterns formed on an insulative substrate wherein dummy lands are selectively connected to the interconnection patterns in accordance with the present invention.
Figure 7:
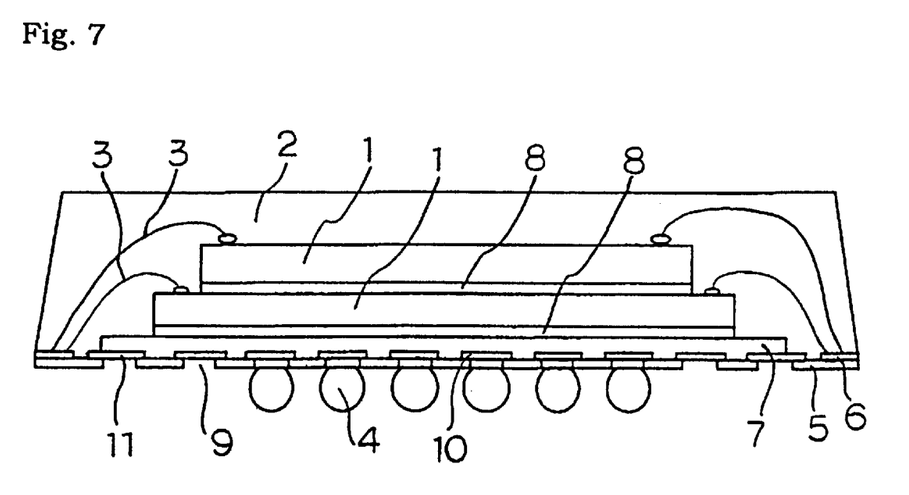
FIG. 7 is a sectional view illustrating a resin overmolded semiconductor device according to a third embodiment of the present invention.

A third embodiment of the present invention shown in FIG. 7 is a semiconductor device which incorporates therein two semiconductor chips 1 arranged in a stacked relation. Since the semiconductor device has a greater number of external connection terminals, dummy lands 11 are utilized to partly form signal interconnections as shown in FIG. 5(b). This arrangement makes it possible to provide an increased number of external connection terminals on the semiconductor device, compared with the second embodiment shown in FIG. 5(a).

The present invention is applicable to a case where a plurality of semiconductor chips incorporated in a semiconductor device are arranged in a stacked relation or in the same plane.

Figure 8:
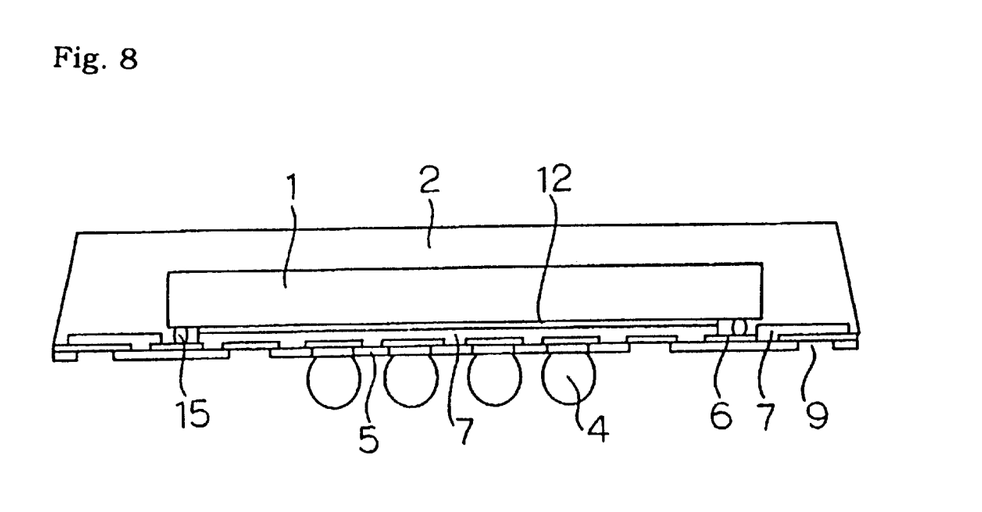
FIG. 8 is a sectional view illustrating a resin overmolded semiconductor device according to a fourth embodiment of the present invention.

A fourth embodiment of the present invention shown in FIG. 8 is a semiconductor device which incorporates therein a semiconductor chip 1 connected to an interconnection board by a face-down flip-chip connection method. In the case where the flip-chip connection method is employed as in the case where the face-up wire bonding method is employed. moisture can be released through dummy lands 11, so that the reliability of the semiconductor device can be ensured in the reflow process even if the adhesive strength between a solder resist film 7 on an insulative substrate 5 and an adhesive material film 12 is not sufficient.

In the present invention, the material for the insulative substrate, the method for the electrical connection between the semiconductor chip and the interconnection patterns on the insulative substrate, the method for the die-bonding of the semiconductor chip, and the material for and the shape of the external connection terminals are not particularly limited. Usable as the insulative substrate are resin substrates such as of a polyimide, a glass epoxy, a BT (bismaleimide triazine) resin, a polyester, a polyamide, a polyethylene fluoride and a glass polyester. The dummy lands are not necessarily required to have the same shape and size as the lands connected to the external connection terminals, and the numbers of the lands and the dummy lands are not particularly limited.

The formation of the through-holes to be located under the dummy lands may be carried out simultaneously with the formation of the through-holes to be located under the lands, or may be achieved by laser etching or wet etching in a separate process.

In accordance with the present invention, as described above, a semiconductor device of a chip size package can be provided which is more reliable than the conventional semiconductor device.

Since through-holes are formed instead of the conventional small holes in an insulative substrate and covered with dummy lands which are not connected to external connection terminals, moisture can be released through the dummy lands for prevention of the swelling of an interconnection board and a like inconvenience. Thus, a higher level of reliability can be ensured.

By increasing the width of interconnection patterns for increase of the total area of the interconnection patterns, spacings between the interconnection patterns can be reduced as much as possible, so that the unevenness of a solder resist application region on the insulative substrate is reduced for planarization of the surface of the solder resist film. Further, dummy patterns are formed in areas within the solder resist application region where provision of the interconnection patterns is not required, so that the total area of the interconnection patterns is increased for reduction of the unevenness of the surface of the solder resist film.

Further, the total area of the interconnection patterns is increased by the formation of the dummy lands, thereby planarizing the surface of the solder resist film. The planarization of the surface of the solder resist film increases areas of the film surface to which the semiconductor chip can firmly be bonded, so that the adhesive strength between the semiconductor chip and the solder resist film can be increased sufficiently to withstand the swelling. Moreover, the reduction in the unevenness of the surface of the solder resist film reduces the surface area of the solder resist film, thereby reducing moisture adsorption with a reduced moisture adsorptive surface area.

Figure 13:
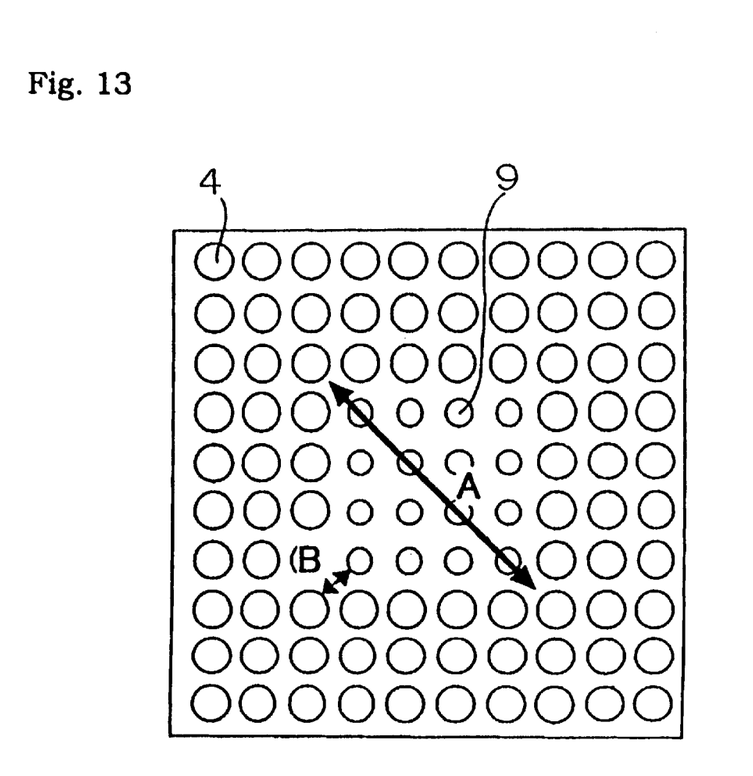
FIG. 13 is a diagram for explaining an influence of thermal linear expansion occurring during a mounting process.

In the case of a conventional semiconductor device having a small size and an area array structure, stresses are liable to occur in solder junctures between an insulative substrate of the semiconductor device and a mount board due to a difference in linear expansion coefficient between the semiconductor device and the mount board and warpage of the semiconductor device which may be caused by a temperature change during a heat cycle or the like, after the semiconductor device is mounted on the mount board through the reflow process. The stresses may result in cracking and breakage of the solder junctures. In accordance with the present invention, on the contrary, the provision of the dummy lands on the through-holes of the insulative substrate minimizes the influence of the stresses in the junctures of the insulative substrate. More specifically, where no dummy land is provided on the substrate, the substrate is subjected to linear expansion occurring on a distance A as shown in FIG. 13. On the other hand, where the dummy lands are provided, the substrate is only subjected to linear expansion occurring on a distance B between the dummy lands because the distance A is segmented by the through-holes. Thus, the reliability of the semiconductor device after the mounting can be improved.

What is claimed is:

1. A resin overmolded semiconductor device comprising:
   an insulative substrate having a plurality of first through-holes formed therein;
   interconnection patterns provided on a chip-side surface of the insulative substrate and having first lands covering the first through-holes;
   external connection terminals provided on a surface of the insulative substrate opposite from the chip-side surface and extending through the first through-holes to be connected to the first lands;
   a semiconductor chip mounted on the chip-side surface of the insulative substrate and electrically connected to the interconnection patterns; and
   a sealing portion in which the semiconductor chip sealed with a resin;
   wherein the insulative substrate is further formed with a plurality of second through-holes each having one end which is open on the surface of the insulative substrate opposite from the chip-side surface, and has second lands which cover the other ends of the second through-holes on the chip-side surface of the insulative substrate and are not connected to the external connection terminals.

2. A resin overmolded semiconductor device according to claim 1, wherein the first lands and the second lands are arranged in a matrix array.

3. A resin overmolded semiconductor device according to claim 1, wherein the second lands are connected to each other to form at least one land group.

4. A resin overmolded semiconductor device according to claim 1, wherein the second lands are selectively connected to the interconnection patterns.

5. A resin overmolded semiconductor device according to claim 1, wherein the external connection terminals are formed as solder balls.

6. A resin overmolded semiconductor device according to claim 1, wherein the resin overmolded semiconductor is of a square type and the first and second lands have the same size and are arranged on the insulative substrate In a matrix array such that the first lands are arranged In a peripheral portion of the matrix and the second lands are arranged in a central portion of the matrix.

7. A resin overmolded semiconductor device according to claim 1, wherein the resin overmolded semiconductor is of a rectangular type and the first and second lands are arranged on the insulative substrate in a matrix array such that the first lands are arranged in a central portion and longitudinal edge portions of the matrix and the second lands are arranged in transverse edge portions of the matrix.

8. A resin overmolded semiconductor device according to claim 1, wherein a plurality of semiconductor chips are incorporated therein.

9. A resin overmolded semiconductor device according to claim 1, wherein the semiconductor chips are connected to the interconnection patterns on the insulative substrate by a face-down flip-chip connection method.

* * * * *